United States Patent
Pei et al.

[11] Patent Number: 5,900,327
[45] Date of Patent: May 4, 1999

[54] POLYFLUORENES AS MATERIALS FOR PHOTOLUMINESCENCE AND ELECTROLUMINESCENCE

[75] Inventors: Qibing Pei; Gang Yu; Yang Yang, all of Santa Barbara, Calif.

[73] Assignee: Uniax Corporation, Santa Barbara, Calif.

[21] Appl. No.: 08/968,852

[22] Filed: Nov. 5, 1997

Related U.S. Application Data

[63] Continuation of application No. 08/610,664, Mar. 4, 1996, abandoned.

[51] Int. Cl.$^6$ .................................................. N05B 33/00
[52] U.S. Cl. ......................... 428/690; 428/691; 428/917; 313/504; 528/422; 528/425
[58] Field of Search ..................................... 428/690, 691, 428/917; 313/504; 528/422, 425

[56] References Cited

U.S. PATENT DOCUMENTS 5,708,130  1/1998  Woo et al. ............................... 528/397

FOREIGN PATENT DOCUMENTS

WO97/05184  2/1997  WIPO.

OTHER PUBLICATIONS

Le Deit et al., "Anodic oxidation of bis(9,9-β-cyanoethyl)fluorene: an efficient way for synthesizing a new functionalizable conducting polymer" *Synthetic Metals,* (1992) 47:373–376.

Rault–Berthelot et al., "Anodic polymerization of difluorenyls linked with polyether or alkyl spacers: synthesis of polyfluorenes with potential complexing properties" *Synthetic Metals,* (1995) 75:1–23.

*Primary Examiner*—Charles Nold
*Attorney, Agent, or Firm*—Burns, Doane, Swecker & Mathis, L.L.P

[57] ABSTRACT

Fluorenes and polyfluorenes having one or two polar-group-containing alkyl substituents on their "9" carbon methylenes are disclosed together with the polymers' use as luminescent materials in organic light-emitting diodes and light-emitting electrochemical cells.

19 Claims, 3 Drawing Sheets

BDOH-PF

EHTOD-PF

HCN-PF

BCN-PF

POLYFLUORENES AS MATERIALS FOR PHOTOLUMINESCENCE AND ELECTROLUMINESCENCE

This application is a continuation, of application Ser. No. 08/610,664, filed Mar. 4, 1996 now abandoned.

FIELD OF THE INVENTION

The present invention relates to polyfluorenes and their use in photoluminescent and electroluminescent devices. More particularly it concerns new polyfluorenes and their synthesis and the use of these polyfluorenes as materials for photoluminescence and for electroluminescence in light-emitting devices including light-emitting diodes and light-emitting electrochemical cells.

BACKGROUND OF THE INVENTION

Electroluminescent diodes (or light-emitting diodes, "LED"s) based on small emitting molecules vapor deposited as thin films from vacuum were reported by Tang et al (C. W. Tang and S. A. Van Slyke, Appl. Phys. Lett. 51, 913 (1987)); double-layer devices emitted 1000 cd/m$^2$ with an external efficiency of 1%. Such organic small molecule LEDs have been extensively developed; Kido et al. (J. Kido, N. Nagai and Y. Okamoto, IEEE Transactions on Electron Devices 40, 1342 (1993)) reported luminance up to 40,000 cd/m$^2$.

In organic LEDs, the active organic luminescent layer(s) are sandwiched between a transparent anode, such as indium/tin-oxide (ITO) as hole-injecting contact and a low work function metal (as electron injecting contact). This structure is described in detail by D. Braun and A. J. Heeger, Appl. Phys. Lett. 58, 1982 (1991); U.S. Pat. No. 5,408,109 and references therein).

Another light-emitting device is referred to as a light-emitting electrochemical cell ("LEC") and presents another approach to light-emitting devices fabricated from conjugated (semiconducting) polymers (Q. Pei, G. Yu, C. Zhang, Y. Yang, A. J. Heeger, Science 269, 1086 (1995), Q. Pei and F. Klavetter, U.S. patent application Ser. No. 08/268763). The light-emitting electrochemical cell comprises a blend of conjugated luminescent polymer and solid electrolyte, said blend serving as the active electroluminescent layer. The operating mechanism proposed for the polymer LEC involves the following steps:

(i) Electrochemical p- and n-doping in the regions adjacent to anode and cathode, respectively, upon application of voltage greater than $E_g/e$ where $E_g$ is the semiconductor energy gap (HOMO to LUMO) of the semiconducting polymer and e is the electronic charge;

(ii) Formation, in situ, of a p-n junction within the active layer.

(iii) Radiative recombination of p- and n-type carriers within the compensated p-n junction.

Because the ions must be mobile during the in-situ electrochemical doping in an LEC, an jonically conductive material needs to be present. The ionically conducting material can be the semiconducting and luminescent polymer, possibly enhanced by blending with a known ion transport polymer, for example, poly(ethylene oxide), PEO. Thus, conjugated luminescent polymers which contain ethylene oxide or other ion transport polymer repeat units in their structures are of particular interest for use in LECs.

Advantages of the polymer LEC include the use of stable metals as the electrodes (for example, gold) and the ability to fabricate the polymer LEC in a planar surface configuration (G. Yu, U.S. patent application Ser. No. 08/444998).

Both the polymer LED and the polymer LEC require semiconducting (conjugated) polymer in the active electroluminescent layer. Moreover, because competing non-radiative recombination of the injected electrons and holes will lead to reduced efficiency for electroluminescence, preferred semiconducting (conjugated) polymers must exhibit a high quantum efficiency for photoluminescence. Equally important, preferred semiconducting (conjugated) polymers must exhibit high stability, particularly stability against degradation because the shelf life and operating life of LEC and LED devices is ultimately dependent upon the stability of the active electroluminescent layer.

Several classes of luminescent polymers have been disclosed in the art heretofore. These include, for example, poly[1,4-phenylene vinylene], PPV (J. H. Burroughs, D. D. C. Bradley, A. R. Brown, R. N. Marks, K. MacKay, R. H. Friend, P. L. Burns and A. B. Holmes, Nature 347, 539 (1990)) and soluble derivatives of PPV, such as MEH-PPV (U.S. Pat. No. 5,189,136) and BCHA-PPV (U.S. patent application Ser. No. 07/626463), PPPV (C. Zhang, H. von Seggern, K. Pakbaz. B. Kraabel, H.-W. Schmidt and A. J. Heeger, Synth. Met. 62, 35 (1994) and references therein) and the like, the soluble derivatives of polythiophene, for example the poly(3-alkylthiophenes) (D. Braun, G. Gustafssom, D. McBranch, J. Appl, Phys. 72, 564, (1992)), the soluble derivatives of polyphenylene (L. Hamaguchi and K. Yoshino, Jpn. J. Appl. Phys. L587 (1995)), and other semiconducting conjugated polymers which exhibit photoluminescence; blends of such semiconducting and luminescent conjugated polymers in hole-transporting or electron transporting polymers or molecules (C. Zhang H. von Seggern, K. Pakbaz, B. Kraabel, H.-W. Schmidt and A. J. Heeger, Synth. Met. 62, 35, (1994); C. Zhang, S, Hoger, K. Pakbaz, F. Wudl and A. J. Heeger, J. Electron. Mater. 23, 453 (1994)), and heterojunctions utilizing layers of semiconducting and luminescent conjugated polymers as donors and acceptors. Other materials proposed in the art include the poly[para-phenylene]s, PPP, and the polythiophenes. The use of soluble derivatives of these basic structures enables relatively simple device fabrication by processing the active layer from solution (A. J. Heeger and D. Braun, U.S. Pat. No. 5,408,109 and references therein).

Alkyl and dialkyl derivatives of polyfluorene have also been used in polymer LEDs (M. Fukuda and K. Yoshino, Japanese Patent No. 02,269,734, Y. Ohmori, M. Uchida, K. Muro and K. Yoshino, Japanese Journal of Applied Physics 30, L1941(1991)).

Although a number of luminescent semiconducting polymers are known in the art, there is a specific need for stable materials with a sufficiently large electronic band gap that they emit blue light. Blue-emitting LEDs and LECs have been disclosed (G. Grem, G. Leditzky, B. Ullrich, and G. Leising, Advanced Materials 4, 36(1992), Y. Ohmori, M. Uchida, K. Muro and K. Yoshino, Japanese Journal of Applied Physics 30, L1941(1991), I. D. Parker, Q. Pei, and M. Morrocco, Appl. Phys. Lett. 65, 1272(1994)), but stable blue-emitting materials which yield LEDs and/or LECs with long lifetimes are not known.

Thus, there is a need for stable, large energy gap, semiconducting (conjugated) polymers which exhibit a high quantum efficiency for photoluminescence. In order to use such materials in light-emitting devices, it is necessary to fabricate optical quality thin films of the semiconducting, luminescent polymers. Thus, there is a need for stable, large energy gap semiconducting (conjugated) polymers which exhibit a high quantum efficiency for photoluminescence and which are processible from solution into optical quality thin films. Moreover there is particular need for conjugated luminescent polymers which are ionically conductive, for example, with ethylene-oxide repeat units present in their structures, because such materials are of particular interest for use in polymer LECs.

Stable, high quantum efficiency photoluminescent polymers are also important for applications which do not involve electroluminescence. Such materials have been demonstrated to be useful, for example, in dye lasers (D. Moses, U.S. patent application Ser. No. 07/904,731). More generally, luminescent materials with high photoluminescent efficiency are useful in a variety of display applications.

SUMMARY OF THE INVENTION

It has now been found that polyfluorenes based upon fluorene repeat units in which the fluorene bridge "9" methylene contains at least one polar-substituted alkyl are excellent photoluminescent materials. These polymers are depicted by the first structure in FIG. 1 in which R1 is an aliphatic group which includes at least one heteroatom-containing polar group and R2 is either hydrogen, an alkyl or an aliphatic group which includes at least one heteroatom-containing polar group. The monomeric fluorenes upon which these polymers are based have also been discovered as have light emitting diodes and light emitting electrochemical cells incorporating the polymers.

In one aspect this invention provides fluorene compounds of the generic formula (A) of FIG. 1 wherein R1 is an aliphatic including at least one heteroatom-containing polar group and R2 is either hydrogen, an alkyl or an aliphatic group including at least one heteroatom-containing polar group.

In an additional aspect this invention provides polymerizable fluorene compounds of the generic formula (B) of FIG. 1 wherein R1 and R2 are as already defined and R3 and R4 are each polymerization-enabling leaving groups.

In a further aspect this invention provides polyfluorenes having the repeat mer unit of generic formula (C) of FIG. 1 wherein R1 and R2 are as already defined. These materials can be homopolymers or copolymers and will have values for n ranging from about 3 to about 10,000.

In a further aspect this invention provides light-emitting organic solid state devices in which a polyfluorene of the invention is incorporated into a layer of an electrically activated luminescent organic polymer positioned between a hole-injecting electrode and an electron-injecting electrode. These devices can be configured as light-emitting diodes or as light-emitting electrochemical cells.

Additionally, this invention can take the form of a method for generating light by applying a solid-state device activating voltage across the hole injecting electrode and electron injecting electrodes of one of the light-emitting devices of the invention, thereby giving rise to light emission from the device's layer of electroluminescent organic polymer and detecting the emitted light.

DETAILED DESCRIPTION OF THE INVENTION

Brief Description of the Drawings

This invention will be described with reference being made the drawings in which:

FIG. 6 also includes the spectrum of the same emission measured through RGB color filters.

DESCRIPTION OF THE PREFERRED EMBODIMENTS

The Fluorenes

Figure 1A:
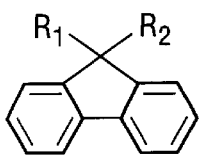
FIG. 1 is a series of molecular structures illustrating (A) a generic structure for the fluorenes of the invention, (B) a generic structure for the polymerizable fluorenes of the invention, (C) a generic formula for the polyfluorenes of the invention, and (D–G) formulae for specific polyfluorenes of the invention.
Figure 1B:
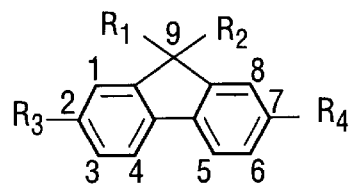
Figure 1C:
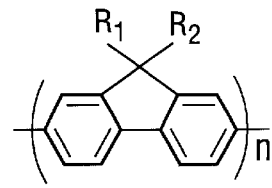
Figure 1D:
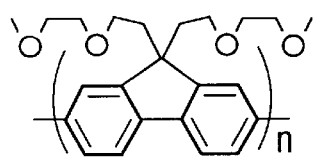
Figure 1E:
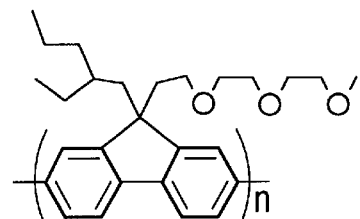
Figure 1F:
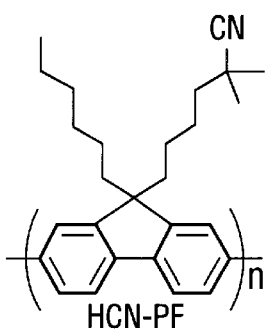
Figure 1G:
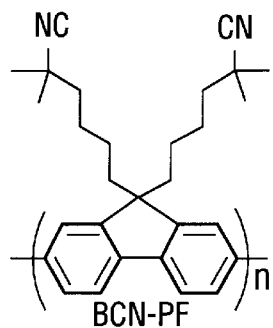

The fluorenes of the invention are depicted in FIG. 1 as A. In A, R1 is an aliphatic group which includes at least 1 heteroatom-containing polar group.

R1 typically contains at least about 1 carbon in its aliphatic portion and especially from 1 to about 30 carbon atoms and more preferably 1 to 20 carbon atoms. A "lower" aliphatic group or alkyl is from about 1 to about 15 atoms in length. The aliphatic portion of R1 can be saturated (alkyl) or olefinically unsaturated (alkenyl) and can be linear or branched. The heteroatom groups can be pendant from the aliphatic chains and/or can interrupt the aliphatic chains. In the case of interruption, the above-recited carbon lengths are totals for both sides of the interruptions. The aliphatic portion may contain up to 3 olefinic unsaturations.

The polar groups present in R1 can be selected generally from those oxygen-, nitrogen-, sulfur- and phosphorus-containing groups known in the art. Representative oxygen-containing groups include ether, hydroxyl, ester, acid and the like. Representative nitrogen-containing groups include amine (primary, secondary and tertiary), cyano, amide, imine and the like. Representative sulfur-containing groups include sulfonate, sulfate, sulfite, sulfide, thiol, mercapto and the like. Representative phosphorus-containing groups include, phosphate, phosphine, phosphazene and the like. The polar groups can present cyclization of a portion of the R1 group such as occurs when cyclic ethers are present.

The R1 group can include mixtures and combinations of these substituents, as well.

The number of polar groups is at least 1 and typically is 1 to 3 with the exception of ether oxygens where the number is often larger ranging from 1 to 10 and especially 2 to 5.

Preferred R1 groups are cyano-substituted alkyls containing 1 or 2 cyanos on 4 to 10 carbon atom linear or branched alkyls and polyethers containing 2 to 5 ether oxygens separated from one another by 1, 2 or 3 carbon alkyl bridges. These latter materials are particularly preferred for use in LEC structures where the polyether groups present in the R1 chains are polyoxymethylenes, polyethylene oxides or polypropylene oxides all of which are known to be polymer electrolytes and thus suitable for promoting ionic transport in the material. Other polar functionality in the R1 group which promotes ion transport is preferred for fluorene groups destined for use as polymers in the LEC structures.

R2 can be identical to R1 or it can be a different polar group-containing aliphatic group or it can be hydrogen or an alkyl. If an alkyl, R2 can have from about 1 to about 30 carbons and preferably 1 to about 15 carbons.

Examples of alkyl R2s include n and iso butyl, pentyls, both linear and branched, hexyls, octyls, including 2-ethyl hexyl, up through hexadecyls and beyond with and without olefinic unsaturation.

When these fluorenes are polymerized, the R1 and R2 groups essentially become sidechains off of the polyfluorene core. Thus, the final selection of R1 and R2 groups should take into account the role these sidechains may play in the properties of the final polymer. These properties include electronic properties, solubility properties, processibility properties, film-forming properties, to enhance or to reduce interchain interaction, to induce solubility in organic solvents, to induce compatibility in blends with host polymers, to induce high dielectric constant so as to solvate ions, to enhance ionic mobility, etc.

The Polymerizable Fluorenes

The polyfluorenes are commonly produced by polymerizing preformed fluorene units of Formula (A). To do this, the fluorenes of Formula (A) are typically further derivatized to introduce polymerization-enabling leaving groups. These groups are removed during polymerization. Bromo groups are conveniently introduced into the fluorenes and are very suitable leaving groups although other art-known polymerizable groups can be incorporated. The fluorene monomers in polymerizable form are depicted in Formula (B) wherein R3 and R4 are the leaving groups.

The Polyfluorenes

The polyfluorenes of this invention are depicted generically by Formula (C) in FIG. 1. These polyfluorenes typically have at least 3 repeat units (i.e. n equals at least 3) and can be very large molecules with n ranging as high as 10,000 or greater.

Molecular weight is not seen to be critical and may vary as desired to achieve other desired properties such as solubility, processibility, formability and the like.

The polyfluorenes may be homopolymers. They also may be copolymerized with other monomers. Usually copolymerization is used to reduce the cost of materials by reducing the fluorene content. Representative copolymer materials include olefin units such as ethylene, propylene or the like, aromatic units such as styrene, ester units and the like.

If copolymeric units are present it will be appropriate to select the leaving groups R3 and R4 to accommodate the comonomers in the copolymerization.

The relative weight proportion of comonomer units will range from 100:0 (for a pure polyfluorene homopolymer) to about 10:90 for a highly diluted material. This lower level can be varied, as desired, of course.

Preparation

The fluorenes and polyfluorenes are prepared as illustrated in the Examples with feed stocks being varied as will be apparent to achieve the range of materials contemplated.

Device Configurations

Generally, polymer light-emitting diodes comprise an electron injecting contact, for example a relatively low work function metal (Ca, Al, or the like) as one electrode on the front of a semiconducting and luminescent conjugated polymer film comprising the present polyfluorenes. This luminescent polymer film has, in turn been deposited on a substrate which has been partially coated with a layer of transparent conducting material with higher work function (high ionization potential) to serve as the second (transparent) electron-withdrawing electrode. This configuration is well known for polymer LEDs (D. Braun and A. J. Heeger, Appl. Phys. Lett. 58, 1982 (1991)). In this configuration, any low work function (low ionization potential) conducting material can be used as the electron injecting contact. In addition, any relatively high work function (high ionization potential) transparent conducting material, such as for example, ITO or polyaniline (PANI) in the conductive emeraldine salt form, can be used as the second (transparent) electron-withdrawing (or hole injecting) electrode.

Typical film thicknesses of the polyfluorene-containing semiconductive and luminescent polymers range from about a hundred Ångstrom units to a millimeter or so. More commonly thickness is in the range of from a 200 Ångstroms to a 10,000 Ångstroms. Although the active film thicknesses are not critical, device performance can typically be improved by using the thinner films. The polyfluorenes can be the sole luminescent polymer in the film or it can be combined with other materials known heretofore.

The low work function metal electrode is typically vacuum evaporated onto the top surface of the active organic layer. Useful metals are well known in the art and include, for example pure metals such as Ca, Al, and In, as well as low work function metal alloys such as Ag:Mg, and Al:Li. Any low work function (low ionization potential) conducting material can be used in place of a conventional metal as the electron injecting contact. The thickness of the electron injecting electrode film is not critical and can be adjusted to achieve the desired surface resistance (surface resistance or sheet resistance is defined as the resistivity divided by the thickness).

In light-emitting electrochemical cell configurations an ionically conductive species is present with the polyfluorene luminescent polymer. The proportions of polyfluorene and ionic species source in an LEC active layer can vary throughout the range which permits light to be emitted, for example from about 0.1:0.9 to about 0.9:0.1 on a weight basis. At the present time ranges of from about 0.2:0.8 to about 0.8:0.2 and especially from about 0.3:0.7 to about 0.7:0.3 are preferred.

Ionic species may be provided by incorporation in the composite material of an electrolyte, by which is meant an ionically bound positively charged cation and negatively charged anion which ionize in a solvent or other suitable medium to render said solvent or medium electrically conducting.

In electrochemical light emitting devices, suitable representative salts have cations which include the singly ionized alkali metals, ions of polyvalent metals, metallo-organic cations, and organic cations, and the like.

In a preferred embodiment, the ionic species are provided by a polymer electrolyte. Polymer electrolytes are well known in the art (see, e.g., K. M. Abraham, *Highly Conductive Polymer Electrolytes in Applications of Electroactive Polymers*, B. Scrosati ed., Chapman & Hall, London, 1993) and consist of salt complexes of high polymers containing optimally spaced electron donor atoms or moieties which coordinately bond with the cation of the salt.

Suitable examples of such polymers include poly(ethylene oxide), poly(propylene oxide), poly(dimethyl siloxane), polyoxymethylene, poly(epichlorohydran), poly(phosphazene), poly[bis-(methoxyethoxyethoxy)phosphazene], polyoxetane, polytetrahydrofuran, poly(1,3-dioxolane), poly(ethylene imine), poly(ethylene succinate), poly(ethylene sulfide), poly(propylene sulfide), poly[oligo(oxyethylene) methacrylate], poly[oligo(oxyethylene) cyclotrisphosphazene] and the like, and mixtures thereof. These materials can be added to the luminescent layer. Their functionality can, at least in part, by provided by the polar group-containing R1 and R2 groups present on the polyfluorene. It will be appreciated that the polar groups present in R1 and R2 encompass the mer units found in these ionically conductive polymers and thus the same functionality can be provided directly by the sidechains.

The light-emitting devices have contact layers. These layers serve as electrodes for applying the powering voltage across the polyfluorene-containing luminescent layer. One of these contacts is typically a low work function layer to serve as an electron-injecting layer. The other is of higher work function and is the hole injector. These electrodes may be placed in contact with the layer of polyfluorene material by processing the polyfluorene into a layer on a substrate bearing one electrode and then depositing a second electrode on the free surface of the layer.

Any material capable of forming an electrical pathway for the powering voltage to the polyfluorene layer may be employed as these contact layers. Typical materials include metals such as aluminum, silver, platinum, gold, palladium, tungsten, indium, copper, iron, nickel, zinc, lead and the like; metal oxides such as lead oxide, tin oxide, and the like; graphite; doped inorganic semiconductors such as silicon, germanium, gallium arsenide, and the like; and doped conducting polymers such as polyaniline, polypyrrole, polythiophene, and the like.

In the light emitting devices at least one electrode consists of a semitransparent conductive material such as indium tin oxide, tin oxide, nickel, gold, doped polyaniline, doped polypyrrole, and the like. Preferably, such electrodes have a sheet resistance of about 10 to 1000 ohms per square and an optical transmittance of about 80% or greater for wavelengths longer than about 400 nm. Suitable substrates may be rigid or mechanically flexible and include glass, metals and alloys, and plastics.

ITO has been the most commonly used transparent electrode for polymer LED's. On the other hand, PANI, in the emeraldine salt form prepared according to U.S. Pat. Nos. 5,232,631 and 5,470,505, U.S. patent application Ser. Nos. 07/800,555 and 07/800,559, and in Appl. Phys. Lett. 60, 2711 (1992) has a higher work function than ITO (Y. Yang and A. J. Heeger, Appl. Phys. Lett. 64, 1245 (1994)), and therefore provides better hole injection into the polymer active layer. However, the surface resistance of a very thin PANI film often is too high for some applications. In order to avoid significant voltage drop in the electrode, it is desirable to decrease the surface resistance of the anode to less than about 100 ohms/square. This can be achieved using a thicker layer (greater than 2500 Å) of PANI.

Both the polymer LED and the polymer LEC require semiconducting (conjugated) polymer in the active electroluminescent layer. Moreover, because competing non-radiative recombination of the injected electrons and holes will lead to reduced efficiency for electroluminescence, preferred semiconducting (conjugated) polymers must exhibit a high quantum efficiency for photoluminescence.

Equally important, preferred semiconducting (conjugated) polymers must exhibit high stability, particularly stability against degradation because the shelf life and operating life of LEC and LED devices is ultimately dependent upon the stability of the active electroluminescent layer. The present polyfluorenes offer these advantages.

Although a number of luminescent semiconducting polymers are known in the art, there is a specific need for stable materials with a sufficiently large electronic band gap that they emit blue light. Blue-emitting LEDs and LECs have been disclosed (G. Grem, G. Leditzky, B. Ullrich, and G. Leising, Advanced Materials, 4, 36(1992), Y. Ohmori, M. Uchida, K. Muro and K. Yoshino. Japanese Journal of Applied Physics, 30, L1941(1991), I. D. Parker, Q. Pei, and M. Morrocco, Appl. Phys. Lett., 65, 1272(1994)), but stable blue-emitting materials which yield LEDs and/or LECs with long lifetimes are not known. The present materials offer this, as well.

Stable, high quantum efficiency photoluminescent polymers are also important for applications which do not involve electroluminescence. Such materials have been demonstrated to be useful, for example, in dye lasers (D. Moses, U.S. patent application Ser. No. 07/904,731). More generally, luminescent materials with high photoluminescent efficiency are useful in a variety of display applications.

Thus, there is a need for stable, large energy gap, semiconducting (conjugated) polymers which exhibit a high quantum efficiency for photoluminescence. In order to use such materials in light-emitting devices, it is necessary to fabricate optical quality thin films of the semiconducting, luminescent polymers. Thus, there is a need for stable, large energy gap semiconducting (conjugated) polymers which exhibit a high quantum efficiency for photoluminescence and which are processible from solution into optical quality thin films. Moreover there is particular need for conjugated luminescent polymers with ethylene-oxide side chains, because such materials are of particular interest for use in polymer LECs. The present polyfluorenes address all of these needs.

EXAMPLES

This invention will be further described by the following Examples:

Example 1

Synthesis of 9,9-bis(3,6-dioxaheptyl)-fluorene:

7.05 g of butyllithium dissolved in 44 ml of hexane was slowly added in 5 minutes into 18.28 g of fluorene dissolved in 150 ml of anhydrous tetrahydrofuran at −50° C. under nitrogen protection. The mixture was stirred at −30~15° C. for 1 hour before it was cooled again to −40~−50° C. Then, 15.23 g of 1-chloro-2-(2-methoxyethoxy)-ethane was added in 5 minutes. The mixture was subsequently stirred for 2 hours while the temperature was gradually increased to 22° C. The main product in the solution was 9-(3,6-dioxaheptyl)-fluorene as detected by GC-MS. This solution was then cooled to −50° C., and 7.1 g of butyllithium dissolved in 44 ml of hexane was slowly added in 5 minutes under nitrogen protection. The mixture was stirred at −30 to −15° C. for 1 hour before it was cooled again to 40 to −50° C. Then, 15.30 g of 1-chloro-2-(2-methoxyethoxy)-ethane was added during 5 minutes. The mixture was subsequently stirred for 5 hours at 22° C., dispersed in water, and extracted with ether. The etheral solution was washed with water and brine, dried with magnesium sulfate, and evaporated. The residue was distilled to collect 37.1 g (91%) of colorless liquid at 160° C./0.08 mm Hg. MS (m/z): 370 (M$^+$), 219, 191, 178, 89, 59.

Example 2

Synthesis of 9-(2-ethylhexyl)-9-(3,6,9-trioxadecyl)-fluorene:

7.69 g of butyllithium dissolved in 48 ml of hexane was slowly added during 5 minutes into 20.0 g of fluorene dissolved in 150 ml of anhydrous tetrahydrofuran at –50° C. under nitrogen protection. The mixture was stirred at –30 to 15° C. for 1 hour before it was cooled again to –40 to –50° C. Then, 23.17 g of 2-ethylhexyl bromide was added in 5 minutes. The mixture was subsequently stirred for 2 hours while the temperature was gradually increased to 22° C. The main product in the solution was 9-(2-ethylhexyl)-fluorene as detected by GC-MS. This solution was then cooled to –50° C., and 7.7 g of butyllithium dissolved in 48 ml of hexane was slowly added in 5 minutes under nitrogen protection. The mixture was stirred at –30~15° C. for 1 hour before it was cooled again to –40 to –50° C. Then, 23.75 g of 1-(2-chloroethoxy)-2-(2-methoxyethoxy)-ethane was added in 5 minutes. The mixture was subsequently stirred for 15 hours at 22° C., dispersed in water, and extracted with ether. The etheral solution was washed with water and brine, dried with magnesium sulfate, and evaporated. The residue was distilled to collect 45.5 g (89%) of colorless liquid at 190° C./0.12 mm Hg. MS (m/z): 424 (M$^+$), 277, 205, 191, 178, 165, 133, 103, 59.

Example 3

Synthesis of 9-hexyl-9-(5-cyano-5-methlhexyl)-fluorene:

2.4 g of butyllithium dissolved in 15 ml of hexane was slowly added during 5 minutes into 6.0 g of fluorene dissolved in 40 ml of anhydrous tetrahydrofuran at –50° C. under nitrogen protection. The mixture was stirred at –30 to 15° C. for 1 hour before it was cooled again to –40 ~–50° C. Then, 6.0 g of 1-bromohexane was added in 5 minutes. The mixture was subsequently stirred for 2 hours while the temperature was gradually increased to room temperature. The mixture was then cooled to –50° C., and 2.4 g of butyllithium dissolved in 15 ml of hexane was slowly added in 5 minutes under nitrogen protection. The mixture was stirred at –30 to 15° C. for 1 hour before it was cooled again to –40~–50° C. Then, 7.6 g of 6-bromo-2,2-dimethylhexanenitrile was added in 5 minutes. The mixture was subsequently stirred for 15 hours at room temperature, dispersed in water, and extracted with ether. The etheral solution was washed with water and brine, dried with magnesium sulfate, and evaporated. The residue was distilled to collect 12.4 g (92%) of light yellow liquid. MS (m/z): 373 (M$^+$), 288, 249, 217, 191, 179, 165.

Example 4

Synthesis of 9,9-bis(5-cyano-5-methlhexyl)-fluorene:

2.4 g of butyllithium dissolved in 15 ml of hexane was slowly added during 5 minutes into 6.0 g of fluorene dissolved in 40 ml of anhydrous tetrahydrofuran at –50° C. under nitrogen protection. The mixture was stirred at –30 to 15° C. for 1 hour before it was cooled again to –40 to –50° C. Then, 7.6 g of 6-bromo-2,2-dimethylhexanenitrile was added in 5 minutes. The mixture was subsequently stirred for 2 hours while the temperature was gradually increased to 22° C. The mixture was then cooled to –50° C., and 2.4 g of butyllithium dissolved in 15 ml of hexane was slowly added in 5 minutes under nitrogen protection. The mixture was stirred at –30~15° C. for 1 hour before it was cooled again to –40~–50° C. Then, 7.6 g of 6-bromo-2,2-dimethylhexanenitrile was added in 5 minutes. The mixture was subsequently stirred for 14 hours at 22° C., dispersed in water, and extracted with ether. The etheral solution was washed with water and brine, dried with magnesium sulfate, and evaporated. The residue was vacuum distilled to remove impurities. 14.1 g (95%) of light yellow liquid was obtained. MS (m/z): 412 (M$^+$), 288, 207, 191, 178, 165.

Example 5

Synthesis of 9,9-bis(3,6-dioxaheptyl)-2,7-dibromofluorene:

96.0 g of bromine was slowly added into 37.0 g of 9,9-bis(3,6-dioxaheptyl)-fluorene dissolved in 100 ml of N,N-dimethylformamide containing a few crops of iron. After 5 minutes, 3 g of sodium hydroxide dissolved in 20 ml of water was added dropwise. The mixture was then dispersed in ether, repeatedly washed with water, dried with magnesium sulfate, and evaporated. The residue was column chromatographed through silica gel using hexane/ether (1:1) as the eluent. After the solvent was evaporated, 38.0 g (72%) of light yellow liquid was obtained. MS (m/z): 528 (M$^+$), 379, 350, 298, 269, 217, 202, 189, 176, 89, 59.

Example 6

Synthesis of 9-(2-ethylhexyl)-9-(3,6,9-trioxadecyl)-2,7-dibromofluorene:

24.0 g of bromine was slowly added into 21.2 g of 9-(2-ethylhexyl)-9-(3,6,9-trioxadecyl)-fluorene dissolved in 100 ml of N,N-dimethylformamide containing a few crops of iron. After 5 minutes, 2 g of sodium hydroxide dissolved in 15 ml of water was added dropwise. The mixture was then dispersed in ether, repeatedly washed with water, dried with magnesium sulfate, and evaporated. The residue was column chromatographed through silica gel using hexane/ether (1:1) as the eluent. After the solvent was evaporated, 27.0 g (82%) of colorless liquid was obtained. MS (m/z): 582 (M$^+$), 350, 337, 270, 203, 189, 176, 133, 103, 57.

Example 7

Synthesis of 9,9-bis(5-cyano-5-methlhexyl)-2,7-dibromofluorene:

24.0 g of bromine was slowly added into 20.6 g of 9,9-bis(5-cyano-5-methlhexyl)-fluorene dissolved in 60 ml of N,N-dimethylformamide containing a few crops of iron. After 5 minutes, 2 g of sodium hydroxide dissolved in 15 ml of water was added dropwise. The mixture was then dispersed in ether, repeatedly washed with water, dried with magnesium sulfate, and evaporated. The residue was column chromatographed through silica gel using hexane/ether (1:1) as the eluent. After the solvent was evaporated, 25.6 g (90%) of light yellow liquid was obtained. MS (m/z): 570 (M$^+$), 446, 367, 323, 281, 251, 207, 191, 176.

Example 8

Synthesis of poly[9,9-bis(3,6-dioxaheptyl)fluorene-2,7-diyl) (BDOH-PF):

9,9-bis(3,6-dioxaheptyl)-2,7-dibromofluorene (5.0 g), triphenylphosphine (2.59 g), zinc dust (3.94 g), 2,2'-dipyridyl (0.13 g), and nickel chloride (0.11 g) were placed in a 100 ml flask and purged with nitrogen. N,N-dimethylformamide (40 ml) was added via syringe and the mixture was stirred at 70° C. for 2 days. The mixture was cooled, filtered, and dialyzed (MWCO=1,000) against methanol and water. The solid that precipitated was collected on filter paper and redissolved in THF. The solution was poured into water to effect precipitation of light yellow solid which was further purified by dissolution in tetrahydrofuran and precipitation in methanol. 0.74 g (21%) of light yellow solid was obtained. GPC determined molecular weight (polystyrene standard): $M_w$=214,900, $M_n$=94,200, PD=2.3. Thin films spin cast from a solution in tetrahydrofuan has a UV-Vis absorption peak at 380 nm, photoluminescent emission peaks at 432, 450, and 540 nm, and photoluminescence quantum efficiency about 78% (relative to a dilute solution of coumarin 480 in ethanol whose quantum efficiency was reported to be 93%).

Example 9

Synthesis of poly[9-(2-ethylhexyl)-9-(3,6,9-trioxadecyl)-fluorene-2,7-diyl) (EHTOD-PF):

9-(2-ethylhexyl)-9-(3,6,9-trioxadecyl)-2,7-dibromofluorene (4.0 g), triphenylphosphine (1.73 g), zinc dust: (2.18 g), 2,2'-dipyridyl (0.052 g), and nickel chloride (0.043 g) were placed in a 100 ml flask and purged with nitrogen. N.N-dimethylformamide (25 ml) was added via syringe and the mixture was stirred at 60–70° C. for 2 days. The mixture was cooled, filtered, and dialyzed (MWCO=1,000) against methanol and water. The solid that precipitated was collected on filter paper and redissolved in THF. The solution was poured into water to effect precipitation of light yellow solid which was further purified by dissolution in tetrahydrofuran and precipitation in methanol/water. 0.92 g (32%) of light yellow solid was obtained. GPC determined molecular weight (polystyrene standard): $M_w$=41,400, $M_n$=21,100, PD=2.0. Thin films spin cast from a solution in tetrahydrofuan has a UV-Vis absorption peak at 378 nm, photoluminescent emission peaks at 430 and 450 nm, and photoluminescence quantum efficiency about 75% (relative to a dilute solution of coumarin 480 in ethanol whose quantum efficiency was reported to be 93%).

Example 10

Synthesis of poly[9,9-bis(5-cyano-5-methlhexyl)-fluorene-2,7-diyl) (BCN-PF):

9,9-bis(5-cyano-5-methlhexyl)-2,7-dibromofluorene (3.92 g), triphenylphosphine (1.73 g), zinc dust: (2.18 g), 2,2'-dipyridyl (0.052 g), and nickel chloride (0.043 g) were placed in a 100 ml flask and purged with nitrogen. N.N-dimethylformamide (25 ml) was added via syringe and the mixture was stirred at 70° C. for 2 days. The mixture was cooled and poured into methanol. The solid that precipitated was collected on filter paper and redissolved in THF. The solution was filtered to remove residual zinc and then mixed with methanol to effect precipitation of light yellow solid which was further purified by dissolution in tetrahydrofuran and precipitation in methanol. 0.75 g (27%) of light yellow solid was obtained. GPC determined molecular weight (polystyrene standard): $M_w$=26,000, $M_n$=13,700, PD=1.9. Thin films spin cast from a solution in tetrahydrofuan has a UV-Vis absorption peak at 378 nm, photoluminescent emission peaks at 428, 450, and 525 nm, and photoluminescence quantum efficiency about 64% (relative to a dilute solution of coumarin 480 in ethanol whose quantum efficiency was reported to be 93%).

Example 11

Synthesis of poly [9,9-bis(5-cyano-5-methlhexyl)-fluorene-2,7-diyl) (BCN-PF) using iron(III) chloride:

9,9-bis(5-cyano-5-methlhexyl)fluorene (4.7 g) dissolved in 8 ml of chloroform was added slowly into 7.41 g of ferric chloride dispersed in 55 ml of chloroform at 0° C. The mixture was stirred at 22° C. under nitrogen protection for 2 days, and poured into methanol. The solid that precipitated was collected on filter paper and Soxlet extracted successively with methanol and tetrahydrofuran. The tetrahydrofuran extract was mixed with methanol to effect precipitation of light brown solid which was further purified by dissolution in tetrahydrofuran and precipitation in methanol. 1.09 g (26%) of light brown solid was obtained. GPC determined molecular weight (polystyrene standard): $M_w$=159,000, $M_n$=61,900, PD=2.6. Thin films spin cast from a solution in tetrahydrofuan has a UV-Vis absorption peak at 378 nm, photoluminescent emission peaks at 425, 450, and 525 nm, and photoluminescence quantum efficiency about 45% (relative to a dilute solution of coumarin 480 in ethanol whose quantum efficiency was reported to be 93%).

Example 12

Synthesis of poly[9-hexyl-9-(5-cyano-5-methlhexyl) fluorene-2,7-diyl) (HCN-PF) using iron(III) chloride:

9-hexyl-9-(5-cyano-5-methlhexyl)-fluorene (1.86 g) dissolved in 5 ml of chloroform was added slowly into 7.41 g of ferric chloride dispersed in 25 ml of chloroform at 0° C. The mixture was stirred at 22° C. under nitrogen protection for 3 days, and poured into methanol. The solid that precipitated was collected on filter paper and Soxlet extracted successively with methanol and tetrahydrofuran. The tetrahydrofuran extract was mixed with methanol to effect precipitation of light brown solid which was further purified by dissolution in tetrahydrofuran and precipitation in methanol. 0.59 g (32%) of light brown solid was obtained. Thin films spin cast from a solution in tetrahydrofuan has a UV-Vis absorption peak at 380 nm, photoluminescent emission peaks at 422, 450, and 530 nm, and photoluminescence quantum efficiency about 62% (relative to a dilute solution of coumarin 480 in ethanol whose quantum efficiency was reported to be 93%).

Example 13

Figure 2:
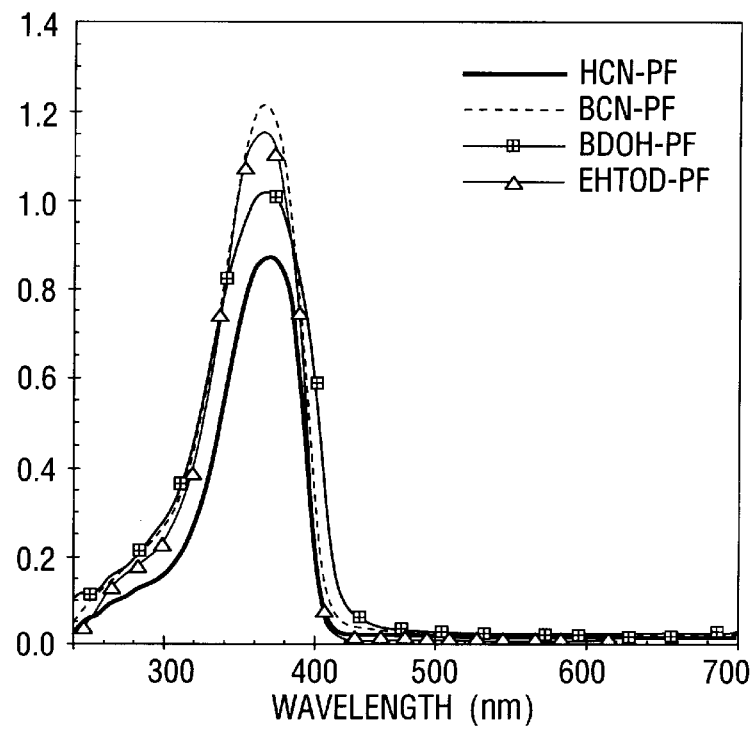
FIG. 2 is a series of absorption spectra of the polyfluorenes shown in FIG. 1.

The polyfluorenes BDOH-PF, EHTOD-PF, BCN-PF, and HCN-PF are soluble in tetrahydrofuran, chloroform, chlorobenzene, toluene, N,N-dimethylformamide, N,N-dimethylacetamide, cyclopentanone, cyclohexanone, pyridine, and the like, up to a concentration of 1 gram of polymer per 10 ml of solvent. The resulting solutions are clear and colorless or light yellow. The solutions were used to spin-cast and dip-coat thin films which were colorless or light yellow and transparent. No crystal particles or other particles in the films were observed under an optical microscope. In particular, the polymer solutions of the concentration 2 gram polymer per 100 ml of tetrahydrofuran were used to spin cast thin films on glass substrates. The spin speed was 1000 to 3000 rpm. The UV-visible absorption spectra of these thin films were taken and are displayed in FIG. 2. The absorption of the films in the visible range is small, confirming the transparency of the films. The absorption peaks are in the same range (378–380 nm), almost independent of the side groups.

Example 14

The photoluminescence spectra of the films described in example 13 were taken using a CCD array spectrophotometer. The emission color was blue-green for HCN-PF, green-blue for BCN-PF, sky blue for BDOH-PF, and blue for EHTOD-PF. The photoluminescence quantum efficiency of these films were determined by using an integrating sphere to measure the total power of the emitted light from the samples; the resulting quantum efficiencies are shown in the Table below. Coumarin 480 dissolved in ethanol (1 mg coumarin 480 in 100 ml ethanol) with a photoluminescence efficiency of 93%, was used as the standard.

TABLE 1

Photoluminescence efficiency of poly(alkylfluorenes)

| Sample | PL efficiency (%)# |
|---|---|
| BDOH-PF | 78.4 |
| EHTOD-PF | 75.4 |
| HCN-PF | 61.6 |
| BCN-PF (FeCl$_3$) | 45.4 |
| BCN-PF (Ni$^0$) | 64.0 |

Spin-cast thin film, thickness approximately 1000Å, optical density of approx. 1.

Example 15

Light-emitting electrochemical cells (LECs) were fabricated using BDOH-PF on a transparent, indium-tin oxide (ITO) coated glass substrate.

Side groups which are attached to the BDOH-PF main chain contain ethylene-oxide moieties with molecular structure similar to that of PEO. These side groups serve multiple purposes. First, the side-group increases the solubility of BDOH-PF in common organic solvents. Second, the similarity of the molecular structure of the side groups of BDOH-PF to the molecular structure of PEO implies compatibility of BDOH-PF with PEO. This enabled control of the morphology of the phase separation between the host EL polymer and PEO in the LEC. The compatibility between PEO and EL polymers is one of the major technical obstacles for polymer LECs. The built-in ethylene oxide side groups help alleviate this problem.

A solution of 2% PF in cyclopentanone was prepared. The PF polymer to Li salt concentration are kept at 5.6:1 ratio. Polymer films of BDOH-PF were spin-cast onto the ITO/glass substrates, with film thicknesses approx. 1000–1500 Å. Aluminum electrode were vacuum deposited onto the BDOH-PF films at 10$^{-6}$ torr vacuum. The device area was about 12mm$^2$.

The LECs prepared in this way using BDOH-PF were uniform and bright. The operating lifetime was more than ten hours. LECs fabricated with this structure emitted sky blue light at a bias voltage greater than 2.8 V and reached 200 cd/m$^2$ at 3.1 V and greater than 1000 cd/m$^2$ at 3.5 V. The measured external quantum efficiency of device was approx. 4% photons per electron injected. The power efficiency was approx. 12 lumen per watt.

The device characteristics recorded for these two bias conditions are summarized in the Table 2.

TABLE 2

| BDOH-PF Blue LEC data | | |
|---|---|---|
| BDOH-PF LEC | | |
| BDOH-PF LEC | | |
| Bias (V) | 3.1 | 3.5 |
| Current (mA) | 0.52 | 3.57 |
| Light output (cd/sq-m) | 200 | 1000 |
| Optical Power (μW) | 34.2 | 180 |
| Photopic Sensitivity (0.87) | 0.87 | 0.87 |
| Efficiency in Lumens/Watt | 12.61 | 8.56 |

TABLE 2-continued

| External Quantum Efficiency (%) | 4% | 2.80% |
|---|---|---|

Example 16

Figure 5:
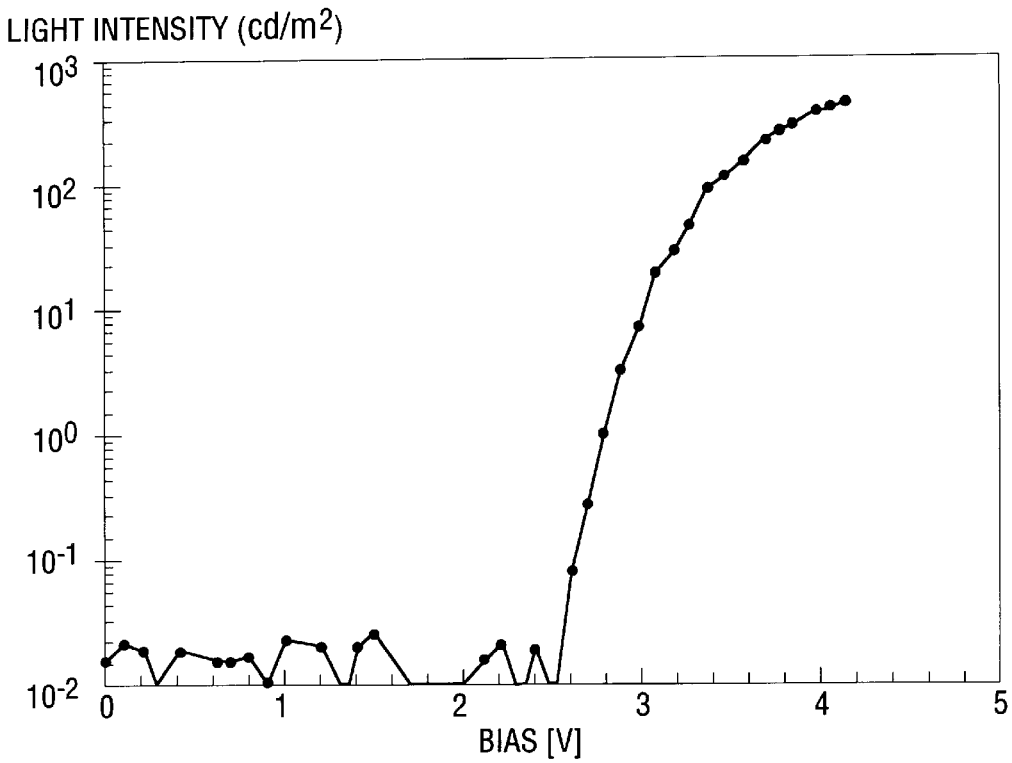
FIG. 5 is a graph of light vs current characteristics of a BDOH-PF-containing LEC. The BDOH is admixed with small amount of PEO (ratio of 10 parts BDOH-PF to one part PEO).

Small amounts of PEO (ratio of 10 parts BDOH-PF to one part PEO) was added to enhance the turn-on response of the LEC. The morphology of the spin-cast films was changed. The device turn-on speed was improved. The current-voltage characteristic of the BDOH-PF LEC (with PEO), is shown in FIG. 5. The device turned-on at 2.5 volts and reached approximately 500 cd/m$^2$ brightness at 4 volts.

Figure 6:
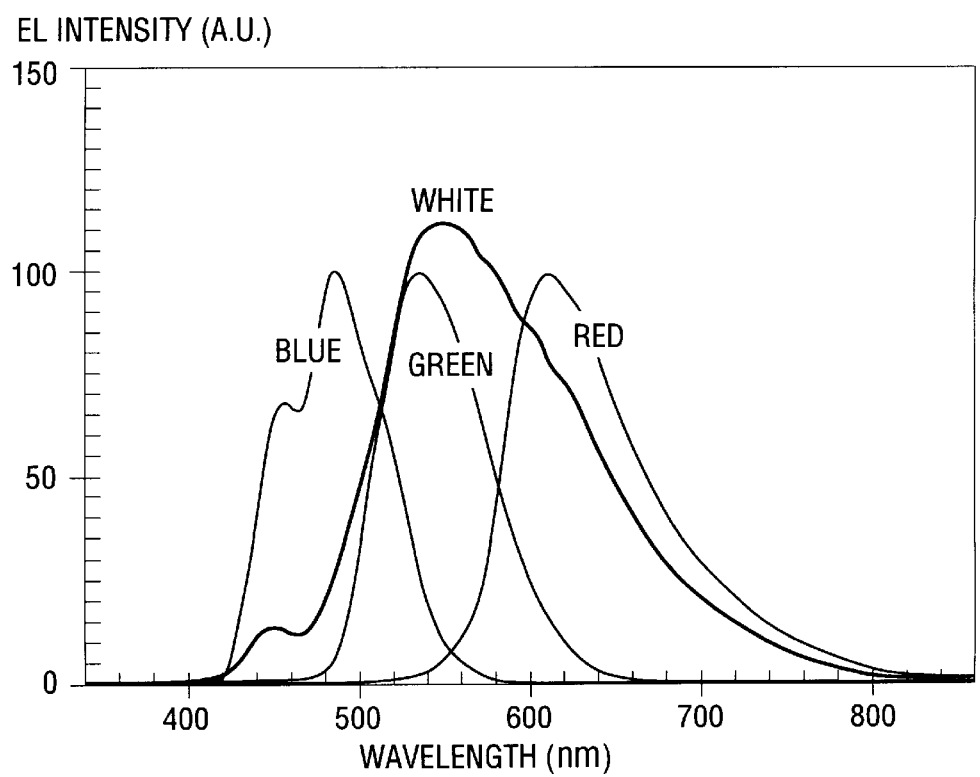
FIG. 6 is a white color electroluminescense spectrum for light emission from a device of the invention.

With addition of the PEO, the EL color changed to white. The device quantum efficiency was approx 2.5% photons/electron (external). This is the highest reported quantum efficiency of any organic/polymer white light-emitting device. The EL spectra of the white light-emitting LEC are shown in FIG. 6. EL spectra with RGB color filters are also shown.

Example 17

Figure 3:
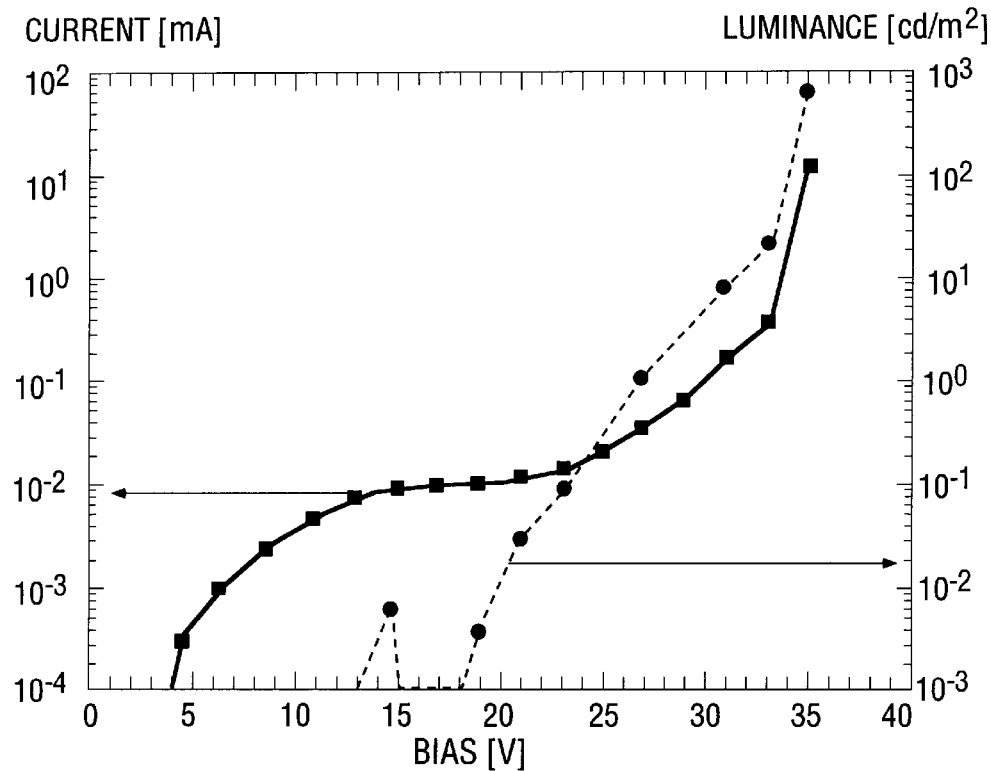
FIG. 3 is a graph of current vs voltage and light emission intensity vs voltage for an LED made with BDOH-PF. This LED has a ITO/BDOH-PF/Ca structure.

Light-emitting diodes were fabricated with BDOH-PF using ITO as the anode and calcium as the cathode; i.e. ITO/BDOH-PF/Ca. The BDOH-PF film was spin-cast at room temperature from CHCl$_3$ solution with 20 mg/lml ratio. Light emission was observed in forward bias for V greater than 15 V. The luminance reached 650 cd/m$^2$ at 40 V (approx. 130 mA/cm$^2$). The EL efficiency is greater than 0.5% for current greater than 1 mA/cm$^2$, as shown in FIG. 3.

Example 18

Example 17 was repeated with a relatively thin BDOH-PF film. The operation voltage of this device was reduced significantly. Light emission was detected for V>5 V; the intensity reached 500 cd/m$^2$ at approx. 20 V.

Example 19

Figure 4:
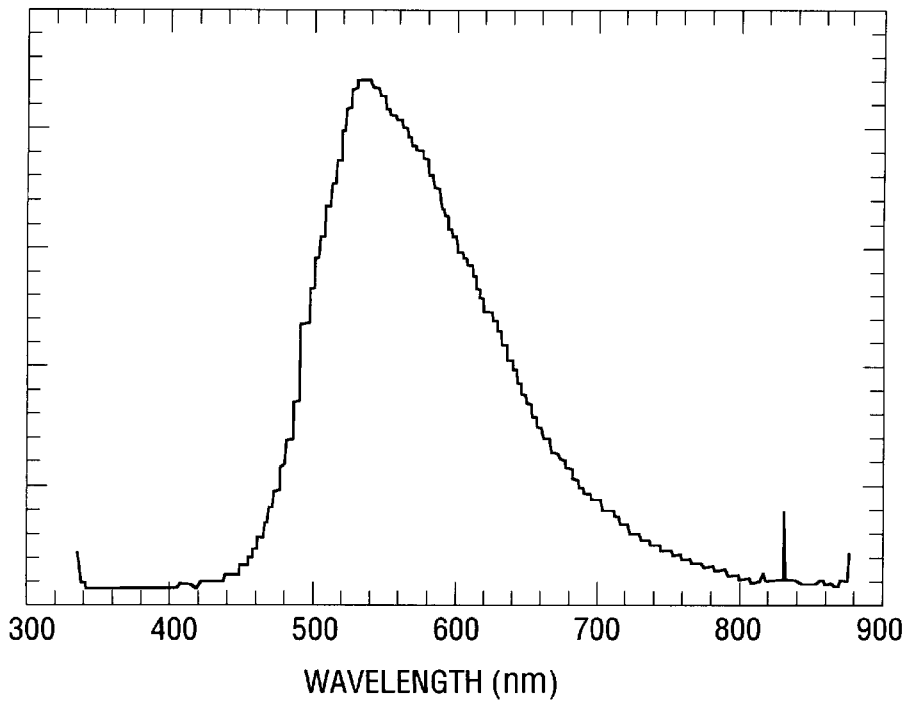
FIG. 4 is an emission spectrum from a polymer LED fabricated from BDOH-PF. This LED has a ITO/BDOH-PF/Ca structure.

Example 17 was repeated and the electroluminescence (EL) emission spectrum was measured as shown in FIG. 4. The EL emission has broader distribution than PL; the EL was shifted toward the yellow/red region relative to the photoluminescence spectrum.

Example 20

Devices were fabricated with a PVK hole transport layer between the anode and the BDOH-PF layer; i.e. in the configuration ITO/PVK/BDOH-PF/Ca. Similar device performance (I-V, L-V, and device efficiency) were observed as described in Examples 17, 18, 19.

Example 21

Poly[9-hexyl-9-(2'-ethyl;hexyl)-fluorene-2,7-diyl), (HEH-PF) was synthesized in a similar manner to HCN-PF as described in example 12. LEDs were fabricated with HEH-PF using ITO as the anode and calcium as the cathode; i.e. ITO/HEH-PF/Ca and ITO/PVK/HEH-PF/Ca. Similar device performance was observed as described in examples 117, 18, 19 and 20. For HEH-PF, the EL emission spectrum covered the entire visible region resulting in white light.

This example demonstrates that HEH-PF LEDs emit white light and can be used for full color displays by combining a matrix of the white color LED with a RGB color filter panel.

Example 22

LEDs were fabricated with HCN-PF in the configurations of ITO/HCN-PF/Ca and ITO/PVK/HCN-PF/Ca. Similar device performance was observed to that described in examples 17 through 21. The device efficiency was 0.3–0.5% ph/el. Again the EL spectrum was shifted toward the yellow/red relative to the PL spectrum.

What is claimed is:

1. In a light-emitting organic solid state device in which an active layer comprising an electrically activated luminescent organic polymer is positioned between a hole-injecting electrode and an electron-injecting electrode, the improvement comprising employing a polyfluorene compound comprising from about 3 to about 10,000 repeat units of the formula

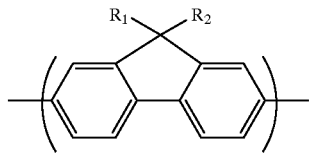

wherein R1 is an aliphatic goup including at least one polar heteroatom-containing group selected from the group consisting of cyano-substituted alkyls containing 1 or 2 cyanos on a 4 to 10 carbon atom linear or branched alkyl and polyethers containing 2 to 5 ether oxygens separated from one another by 1, 2 or 3 carbon alkyl bridges and R2 is selected from the group consisting of hydrogen, alkyls and aliphatic groups including at least one polar heteroatom-containing group, as the electrically activated luminescent organic polymer.

2. The light-emitting device of claim 1 configured as a light-emitting diode.

3. The light-emitting device of claim 1 configured as a light-emitting electrochemical cell.

4. The light-emitting device of claim 3 wherein the active layer additionally comprises an ionic species source.

5. The light-emitting device of claim 3 wherein at least one of R1 and R2 contains polar groups corresponding to mer units of a polymer electrolyte.

6. A method for generating light comprising applying a solid-state device activating voltage across the hole injecting electrode and electron injecting electrodes of the device of claim 1, thereby giving rise to light emission from the device's layer of electroluminescent organic polymer and detecting the emitted light.

7. The light-emitting device of claim 1 wherein R2 is an alkyl.

8. The light-emitting device of claim 1 wherein R2 is R1.

9. The light-emitting device of claim 1 wherein R1 is a polyether containing 2 to 5 ether oxygens separated from one another by 1, 2, or 3 carbon alkyl bridges.

10. The light-emitting device of claim 9 wherein R1 is 3,6-dioxaheptyl or 3,6,9-trioxadecyl.

11. The light-emitting device of claim 1 wherein R1 is a cyano-substituted alkyl containing 1 or 2 cyanos on a 4 to 10 carbon atom linear or branched alkyl.

12. The light-emitting device of claim 1 wherein the polyfluorene is selected from the group consisting of poly(9,9-bis(3,6-dioxaheptyl)-fluorene-2,7diyl), poly(9-(2-ethylhexyl)-9-(3,6,9-trioxadecyl)-fluorene-2,7diyl), poly(9-hexyl-9-(5-cyano-5-methylhexyl)-fluorene-2,7diyl) and poly(9,9-bis(5-cyano-5-methylhexyl)-fluorene-2,7diyl).

13. A polyfluorene compound comprising from 3 to about 10,000 repeat units of the formula

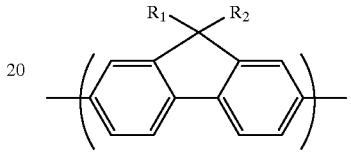

wherein R1 is an aliphatic group including at least one polar heteroatom-containing group selected from the group consisting of cyano-substituted alkyls containing 1 or 2 cyanos on a 4 to 10 carbon atom linear or branched alkyl and polyethers containing 2 to 5 ether oxygens separated from one another by 1, 2 or 3 carbon all bridges and R2 is selected from the group consisting of R1, hydrogen, and an alkyl of from 1 to 30 carbon atoms.

14. The polyfluorene compound of claim 13 wherein R2 is an alkyl.

15. The polyfluorene compound of claim 13 wherein R2 is R1.

16. The polyfluorene compound of claim 13 wherein R1 is a polyether containing 2 to 5 ether oxygens separated from one another by 1, 2, or 3 carbon alkyl bridges.

17. The polyfluorene compound of claim 16 wherein R1 is 3,6-dioxaheptyl or 3,6,9-trioxadecyl.

18. The polyfluorene compound of claim 13 wherein R1 is a cyano-substituted alkyl containing 1 or 2 cyanos on a 4 to 10 carbon atom linear or branched alkyl.

19. The polyfluorene compound of claim 13 selected from the group consisting of poly(9,9-bis(3,6-dioxaheptyl)-fluorene-2,7diyl), poly(9-(2-ethylhexyl)-9-(3,6,9-trioxadecyl)-fluorene-2,7diyl), poly(9-hexyl-9-(5-cyano-5-methlhexyl)-fluorene-2,7diyl) and poly(9,9-bis(5-cyano-5-methylhexyl)-fluorene-2,7diyl).

* * * * *